United States Patent [19]

Beasom

[11] 4,319,257
[45] Mar. 9, 1982

[54] LOW THERMAL COEFFICIENT SEMICONDUCTOR DEVICE

[75] Inventor: James D. Beasom, Melbourne, Fla.

[73] Assignee: Harris Corporation, Melbourne, Fla.

[21] Appl. No.: 112,618

[22] Filed: Jan. 16, 1980

[51] Int. Cl.³ .............................................. H01L 29/90
[52] U.S. Cl. ....................................... 357/13; 357/35; 357/46
[58] Field of Search ......................... 357/22, 13, 46, 35

[56] References Cited

U.S. PATENT DOCUMENTS

| | | |
|---|---|---|
| 3,222,610 | 12/1965 | Evans et al. |
| 3,244,949 | 4/1966 | Hilbiber |
| 3,275,846 | 9/1966 | Bailey |
| 3,323,071 | 5/1967 | Mitchell |
| 3,440,715 | 4/1969 | Seng |
| 3,567,965 | 3/1971 | Weinerth |
| 4,035,827 | 7/1977 | Wheatley |
| 4,138,690 | 2/1979 | Nawa et al. |

Primary Examiner—R. A. Rosenberger
Attorney, Agent, or Firm—Leitner, Palan, Martin & Bernstein

[57] ABSTRACT

A low thermal coefficient NPN bipolar transistor includes a reverse biased buried zener diode formed in the interior of an emitter ring. Thermal compensation results from the symmetry of the base region and the concentric base contact, emitter and collector contact rings about the buried zener diode. A P type region extends the depth of the base region below the zener diode to prevent reach through of the cathode to the collector.

27 Claims, 5 Drawing Figures

LOW THERMAL COEFFICIENT SEMICONDUCTOR DEVICE

BACKGROUND OF THE INVENTION

The present invention relates generally to semiconductor devices and more particularly to a semiconductor device having a low thermal coefficient.

It is well known in the prior art to form a zener diode at the base of an NPN bipolar transistor. An extra N+ diffusion into the base region provides a simple method of forming the reverse biased zener diode in series with the base. As illustrated in FIG. 1, the integrated circuit of the prior art generally includes an N substrate collector 10, a diffused P base region 12, an N+ emitter region 14 formed in the base and an N+ cathode 16 also formed in the base. Metal contacts are shown as collector contact 18, base contact ring 20 surrounding emitter contact 22 and a zener cathode contact 24. This structure, which is disclosed in the U.S. Pat. No. 3,275,846, has a low thermal coefficient but is still susceptible to operating characteristics deviations with temperature changes. The purpose for forming the zener diode in the same island or region of the base emitter of an NPN bipolar transistor is to achieve some form of stability of operating characteristics with changes in temperatures. The design concept is based upon the fact that the reverse biased zener diode has a positive voltage temperature coefficient and the forward biased base emitter PN junction has a negative voltage temperature coefficient. Thus by locating the zener diode and the base-emitter diode as close as possible, it would be affected by the same temperature variance and produce some form of compensation. This relationship is specifically described in U.S. Pat. No. 3,567,965.

Although the device in FIG. 1 has provided an improvement over the prior art devices wherein the zener diode is formed in a separate distinct region from the NPN bipolar transistor, it still does not provide sufficient tracking of the variance of the zener diode characteristics with the base-emitter diode since the base-emitter junction is not symmetric around the breakdown region. Additionally, the zener diode is of the surface type which has high noise and poor stability. Also for high Beta integrated circuit transistors, there is a high probability for the prior art integrated circuit of FIG. 1 of a depletion region spreading into the P base region 12 from the N+ cathode 16 and reaching the collector region 10 before the zener breakdown is reached. If this phenomenon which is called "reach through," occurs, current flows from the cathode of the zener diode into the collector and thereby defeating the intended operation of the component.

Thus their exists a need for an improved integrated circuit having reverse biased zener diode in combination with a base-emitter forward biased diode having improved thermal characteristics.

SUMMARY OF THE INVENTION

An object of the present invention is to provide a semiconductor device having improved thermal characteristics.

Another object of the invention is to provide a reverse biased zener diode in series with a forward biased diode having lower thermal voltage coefficient than prior art devices.

A still further object of the present invention is to provide a reverse biased zener diode in series with a forward biased diode which reduces the probability of reach through.

An even further object of the present invention is to provide an integrated circuit having reverse biased zener diode in series with a forward biased diode with increased electrical characteristic tracking for thermal gradients.

These and other objects of the invention are attained by forming a buried zener diode in the center of an NPN bipolar transistor having concentric symmetrical structure. The reverse biased zener diode includes an N cathode formed in the surface of a base region of the NPN bipolar transistor and a P anode region having a greater impurity concentration than the base region extending from the bottom of the cathode into the base region. By forming the lateral area of the cathode greater than the lateral area of the anode, a buried zener diode junction is formed. A common anode and base contact ring and an emitter ring are formed concentrically about the cathode in the base region and a collector contact is formed in the surface of the collector substrate. To prevent reach through of zener cathode to the collector of the NPN transistor and reduce the series resistance of the anode, a P type region is formed below the cathode and extends laterally to the anode contact ring to increase the depth of the base or extrinsic anode greater than the base region of the NPN bipolar transistor. Alternately, the P extrinsic anode region of greater depth than the base region may extend totally to the surface of the substrate instead of just being an extension of the base diffused region. The base region of the NPN bipolar transistor may be formed separately or may be formed as a concentric ring about a P type region in the N substrate which forms an extrinsic anode portion into which the N cathode and high impurity P anode are formed. Another modification of the basic integrated circuit structure may include forming the cathode and anode as a ring wherein the cathode has an inner diameter less than the inner diameter of the P+ anode and an outer diameter greater than the outer diameter of the P+ anode. An anode contact may be formed in the anode region interior the N cathode ring.

The process of fabrication begins with forming a deep high impurity P type anode region into an N substrate region which will form the collector of the NPN bipolar transistor. Depending upon the device to be formed, the extended P region may then be formed by introducing P type impurities into the surface of the substrate surrounding laterally the previously formed P+ region. Next, P type impurities are introduced to form simultaneously the base and the extrinsic anode region. These two regions may be formed as a continuous circular region or as two separate regions, the base region being concentric about the extrinsic circular lateral extension anode region. The P impurity introducing steps may be performed in reverse. N type impurities are introduced into the surface of the deep P+ anode region and contiguous portions of the extrinsic P anode region or base region to form a cathode having only a buried junction with the P+ anode region, into the base region to form a ring emitter concentric about the N+ cathode and into the substrate collector to form a collector contact ring. P type impurities are introduced into the anode region to form anode contact and into the base region to form a base contact ring. Depending upon the configuration of the final structure, the anode contact and the base ring may be the same structure.

Other objects, advantages and novel features of the present invention will become apparent from the following detailed description of the invention when considered in conjunction with the accompanying drawings.

DESCRIPTION OF THE PREFERRED EMBODIMENTS

Figure 1:
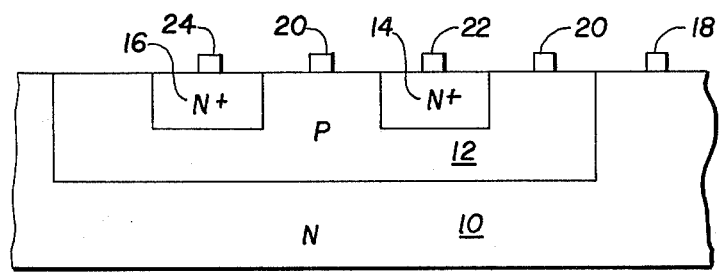
FIG. 1 is a crossectional view of an integrated circuit having a reverse biased zener diode formed in the base of an NPN bipolar transistor of the prior art.
Figure 2:
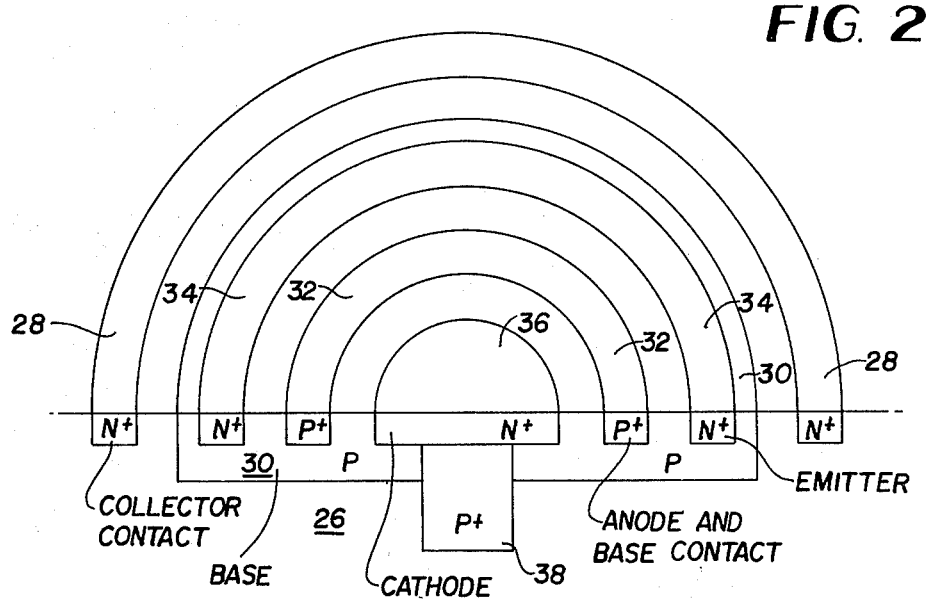
FIG. 2 is a crossectional, perspective view of an integrated circuit having a reverse biased zener diode formed in the base of an NPN bipolar transistor incorporating the principles of the present invention.

An integrated circuit including a reverse biased zener diode formed in the island of a NPN bipolar transistor is illustrated in FIG. 2. The collector region 26 is an N type substrate or island having an N+ collector contact ring 28 therein. A base region 30 is formed interior of the collector ring 28 in the island 26. A P type base contact ring 32 is formed in the base 30 as is an N+ emitter ring 34. At the center of the collector, base and emitter rings and base and collector regions and consequently the center of the NPN bipolar transistor is formed a zener diode. The zener diode includes an N+ cathode 36 formed in the base region 30 and a buried P+ region 38 extending from the bottom of the cathode 36 through the base region 30 and into the collector or substrate region 26. The actual depth of the buried P+ region 38 is not critical as long as it extends from the bottom of cathode 26 into the base region 30 to form a buried zener diode. The relationship of the lateral area of the N+ cathode 36 relative to the P+ anode 38 is such that a buried zener diode is formed wherein that part of the PN junction where breakdown occurs is below the surface. The base contact ring 32 also forms the anode contact such that the base region interior the common anode and base contact ring 32 is considered an extrinsic anode region. By using a buried zener diode configuration, that portion of the PN junction where breakdown occurs is limited to the boundary of the P+ anode 38 and the contiguous portion of the N+ cathode 36 and thereby minimizes the breakdown junction area. By minimizing the breakdown junction area of the zener diode, variance of the electrical characteristics of the zener diode with temperature is minimized. In the prior art structure illustrated in FIG. 1, the zener diode breakdown junction is the total lateral area of the cathode region 16 and consequently a greater breakdown junction area is formed which is more susceptible to temperature gradient variations.

An analysis of the concentric or symmetrical structure of the NPN bipolar transistor relative to the zener diode will show that the forward biased base-emitter diode is self compensating and the placement of the zener diode in the center of the base and emitter allows greater tracking of the electrical characteristics of the zener diode to the base-emitter diode. For example, assume a temperature gradient from the right of FIG. 2 to the left. Such a gradient will heat the portion of the base-emitter junction to the right of the zener diode reducing the $V_{BE}$ of that portion of the base-emitter junction. Also as hot as the right portion of the base-emitter junction is relative to zener diode, the opposite or symmetrical portion of the base-emitter junction on the left side of the zener diode is cooled by the exact same magnitude, thereby raising its $V_{BE}$ so as to exactly cancel the lowering of the $V_{BE}$ on the right side of the zener diode. The net effect is that the overall $V_{BE}$ of the base-emitter diode is effectively the $V_{BE}$ at the temperature of the center of the device. Thus by placing the zener diode in the center of the base-emitter junction, the zener diode and the base-emitter diode are functionally at the same temperature for purposes of electrical characteristics relative to temperature.

Although electrical characteristics or $V_{BE}$ of a forward biased base-emitter junction is proportional to the specific temperature along the total junction, the zener diode has its electrical characteristics determined by the hottest and coolest points at which breakdown occurs. Thus it is important to minimize the area of the junction of the zener diode to minimize the points of hottest and coolest and to have an effective temperature identical to that of the forward biased diode to allow maximum tracking of the zener diode characteristics to the forward biased base-emitter diode characteristics. In a typical example of the configuration illustrated in FIG. 2, the forward biased base-emitter junction has a voltage temperature coefficient of $-2.2$ millivolts per degree centigrade and the zener diode has a positive voltage temperature coefficient of $+2.2$ millivolts per degree centigrade. This produces an effective voltage coefficient for the integrated circuit of the series pair of the reverse biased zener diode and the forward biased base-emitter diode of less than 10 microvolts per degree centigrade.

Although the base contact ring 32 is shown interior the emitter ring 34, their positions may be reversed. This will place the base-emitter diode junction closer to the buried zener breakdown junction and thus increase the tracking of the two devices relative to thermal gradients but results in an increase in the series resistance of the anode-to-anode contact.

Although the integrated circuit configuration of FIG. 2 may be used in most applications, it may not be used in high beta integrated circuit transistors. As with the integrated circuits having reverse biased zener diode formed in the base region of an NPN bipolar transistor as illustrated in FIG. 1, the configuration of FIGS. 1 and 2 have a high probability of the occurrence of a phenomenon called "reach through". This phenomenon results from the depletion layer which spreads into the P base region of extrinsic anode region from the N+ cathode from reaching the collector before the zener diode breakdown is reached. In an effort to eliminate the probability of reach through, the base region or the extrinsic anode region is extended to have a greater depth than the surrounding base region.

Figure 3:
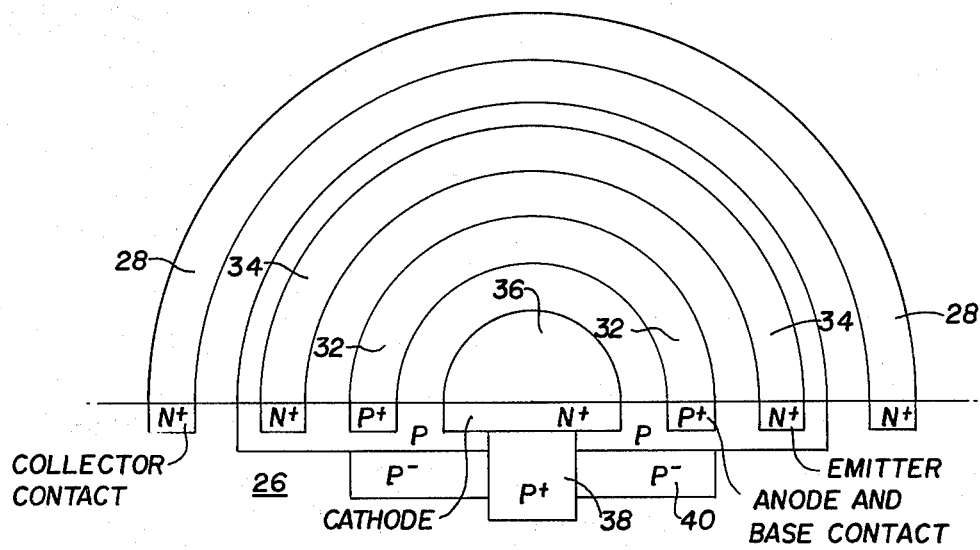
FIG. 3 is a crossectional perspective view of a reverse biased zener diode formed in the base region of an NPN bipolar transistor with an extended base region incorporating the principles of the present invention.

As illustrated in FIG. 3, a buried P- type region 40 is positioned below the N+ cathode region 36 and extends laterally at least to the area below the anode contact region 32. This extends the depth of the base region 30 which forms the extrinsic anode region to a greater depth than that of the base region 30. Although being illustrated as extending laterally to the outer edge of the common anode and base contact 32, the buried extended extrinsic anode region 40 could laterally extend to the inner diameter of the common anode and base contact ring 32. Depending upon the manufacturing process, the base region 30 may be formed to be circular and cover the buried P- extended anode region 40 or the base region 30 may be formed as a ring whereby the P-extended anode region 40 extends totally up to the surface of the substrate to also form the extrinsic anode region equivalent to that shown in FIG. 4.

Figure 4:
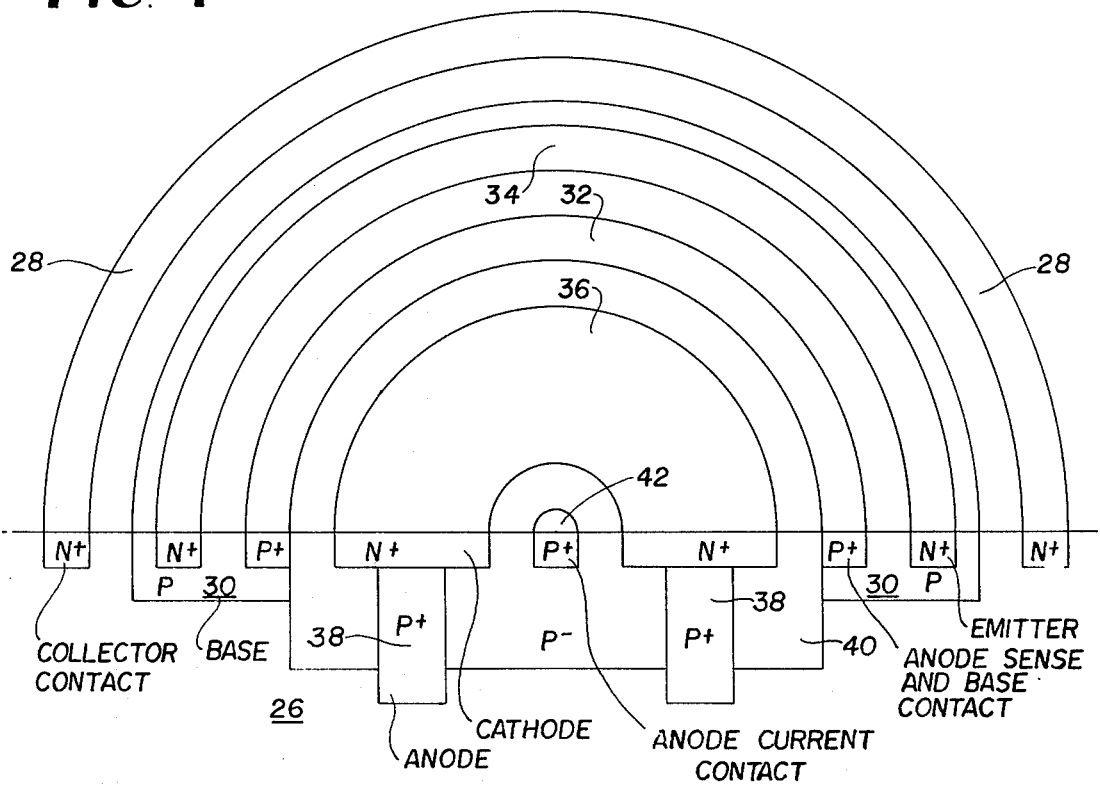
FIG. 4 is a crossectional perspective view of a reverse biased zener diode formed in extended anode region having a Kelvin connection incorporating the principles of the present invention.

The applications of the principles of the present invention illustrated in FIG. 3 to a Kelvin type of contact is illustrated in FIG. 4. As discussed in FIG. 3, the extrinsic, extended anode portion 40 extends from the surface of the substrate down past the base region 30 and into the collector region 26. The N+ region 36 is modified from a circular crossection to an annulus crossection as is the P+ high impurity concentration anode region 38. The outer diameter of the cathode region 36 is greater than the outer diameter of the anode region 38 and the inner diameter of the cathode region 36 is smaller than the inner diameter of the anode region 38. Thus the cathode region 36 completely covers the anode region 38 and produces an annulus buried zener diode breakdown junction. As in FIGS. 2 and 3, an N+ collector contact ring is formed in the collector 26, and an N+ emitter ring 34 is formed in the base region 30 which is now formed as a ring and a P base contact ring 32 is also formed in the base region 30. The primary or current contact for the zener diode anode is an additional P contact region 42 formed in the center of the zener diode in the top surface of the extrinsic anode region 40. The base contact ring 32 may also be used as an anode sense contact 32 ring. Although the Kelvin contact structure of FIG. 4 provides an increased area for the zener diode junction, it has the additional advantages of eliminating the voltage drop developed by the anode current flowing through the anode series resistance and its temperature coefficient from the voltage sensed between anode and cathode terminals. The basic concentric or symmetrical structure of the present invention is still retained in the Kelvin contact structure of FIG. 4.

Figure 5:
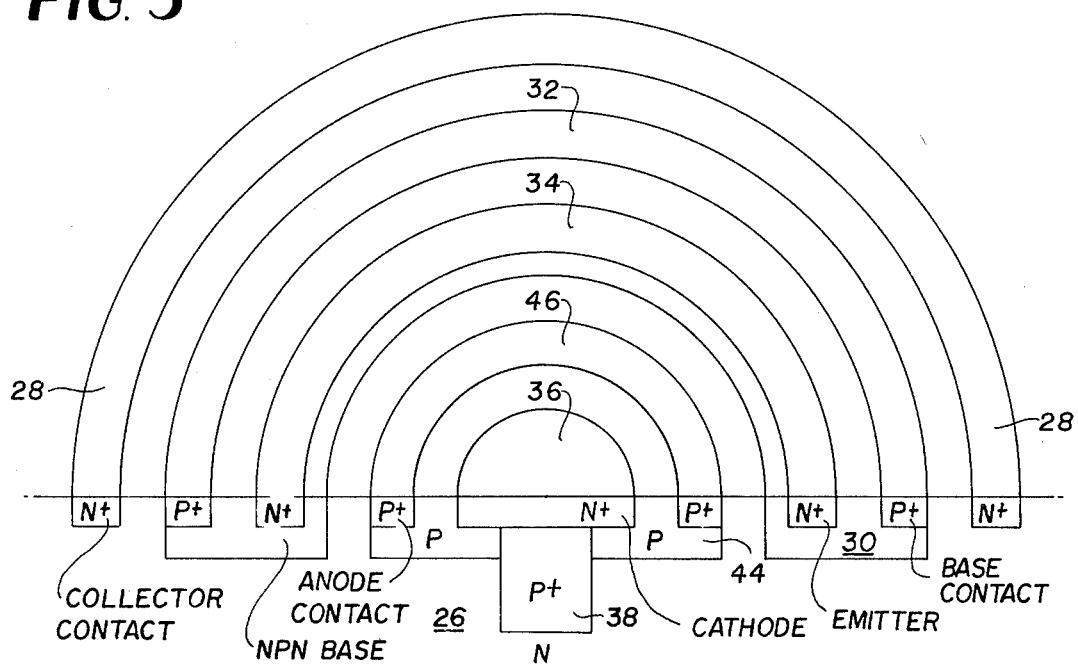
FIG. 5 is a crossectional perspective view of an integrated circuit having a zener diode formed in the collector interior emitter and base rings and incorporating the principles of the present invention.

The integrated circuit structure of FIGS. 2 through 4 have illustrated a zener diode having an anode internally connected in series with the base of a base-emitter diode. For some circuit applications, this structure is inappropriate. FIG. 5 illustrates the principles of the present invention incorporated into an integrated circuit structure wherein the anode of the zener diode is distinct and independent from the base region of the base-emitter diode. The base region 30 is formed as an annulus having base contact ring 32 and emitter ring 34 therein. As noted previously, the emitter ring is interior the base contact ring since the base contact ring 32 does not form a common contact for the anode of the zener diode. This allows the base-emitter junction to be closer to the zener diode and consequently reduce the temperature differential affecting the base-emitting diode and the zener diode. The cathode 36 and the anode 38 of the zener diode are formed in a separate P type region 44 interior of the concentric base annulus 30 which is formed during the same diffusion that forms the base region 30. Thus the extrinsic anode region 44 is a base diffused region. A P+ anode contact ring 46 is formed in the extrinsic anode 44 and is concentric about the zener cathode 36.

Since the separate anode contact 46 is provided for the zener diode from the base contact 32, they may be separately biased. This reduces the probability of reach through occurring and consequently an extended, extrinsic base region equivalent to region 40 in FIGS. 3 and 4 is not necessary. Another advantage of forming the extrinsic anode separate from the base as illustrated in FIG. 5 is the ability to use a triple diffused PNP bipolar transistor instead of the NPN bipolar transistor. By external connections, the base-emitter diode of the PNP transistor is connected in series with the zener diode.

A process for fabricating the integrated circuit of the present invention begins with the formation of the buried anode region 38. P type impurities, for example boron are introduced into the collector substrate 36 to form a deep P+ region resulting as anode 38 having a surface impurity concentration of $5 \times 10^{19}$ carriers per cubic centimeter and depth of 18 microns. If this integrated circuit requires an extended, extrinsic anode region 40, the next step would be to introduce P type impurities for example boron having a surface impurity concentration of $5 \times 10^{17}$ carriers per cubic centimeter and a depth of 12 microns into the surface of the N type substrate 26 to form a region 40 having a depth less than the depth of the anode region 38. Next, P type impurities for example boron are introduced into the surface of the substrate to form the combined base region and extrinsic anode region 30. This region has impurity concentration of $5 \times 10^{18}$ carriers per cubic centimeter and a depth of 3 microns. To produce the structure of the FIG. 4, this diffusion is made through a mask to form the base ring 30 while the extended, extrinsic anode region 40 is covered by masking material. To produce the structure of FIG. 5, an annulus base ring 30 and extrinsic anode region 44 are simultaneously formed during this base diffusion using appropriate mask. As discussed previously, the P+ anode region 38 need not exceed the depth of the extinsic anode region 4 or have an extrinsic anode region 30. If P+ anode region 38 is not to exceed these regions, it may be formed after the formation of regions 30 and 40.

Next, impurities are introduced to form either the N+ surface region or the P+ surface regions. By way of example, N+ impurities are introduced into the surface of the anode 38 and contiguous regions of the extrinsic anode to form the N+ cathode region 36 to have a greater surface area than the previous performed anode region 38, into base region 30 to form the emitter ring 34 and into the collector surface 26 to form the collector contact ring 28. These N+ regions have an impurity concentration of $1 \times 10^{21}$ carriers per cubic centimeter and a depth of 2.7 microns. P impurities are then introduced through their appropriate mask into the base region 30 to form a base contact ring 32 which may also form as an anode contact ring or into the extrinsic anode region 40 to form Kelvin contact 42 or into extrinsic anode region 44 to form anode contact ring 46. The impurity concentration of a P+ region thus formed have an impurity concentration of $1 \times 10^{20}$ carriers per cubic centimeter and a depth of 2.4 microns. The process is then completed by forming an insulative layer over the substrate forming appropriate contact openings through the insulative layer and contacts therethrough. None of this is shown for sake of clarity.

Although the structures of FIGS. 2–5 have been described as including a diffused base and extrinsic anode region, these regions may be formed by a P epitaxial layer formed on to N substrate 26. The collector contact may be made to the backside of substrate 26 for discrete devices or deep N+ contact regions extending down through the P epitaxial layer and into the substrate 26 may be formed for a top side collector contact.

Although the symbols P, P+ and P− are used, they are just illustrations of relative impurities concentrations as are the examples of the specific impurity concentration given for the process. Depending upon the impurity concentration of the base region 30 or extrinsic anode region 44, the base contact ring 32 and anode contacts 42 and 26 may be P regions instead of P+.

From the preceding description of the preferred embodiments, it is evident that the objects of the invention are attained in that a reverse biased zener structure in series with a forward biased diode is formed having lower voltage temperature coefficient than previous structures. Although the invention has been described and illustrated in detail, it is to be clearly understood that the same is by way of illustration and example and is not to be taken by way of limitation. The present invention is equally applicable if all the conductivity types are reversed resulting in a PNP bipolar transistor and zener buried diode having an N+ cathode covered by a P+ anode. The preferred embodiments have illustrated the forward biased diode as being the base-emitter junction of a NPN transistor. Obviously the principle of the present invention with buried zener plus the symmetrical concentric construction could be used with a buried zener diode used in the center of a forward bias PN diode other than the base-emitter diode. Similarly the principles of the present invention are equally applicable to other positive voltage temperature coefficient devices. For example the zener diode may be replaced by a resistor formed in the center of the symmetrical concentric PN diode with the ability to track more closely the voltage temperature coefficient of the forward biased diode. Although circular concentric structures are illustrated, the principle of the present invention are applicable to any symmetrical structure, for example concentric square regions, and to discrete devices or integrated circuits. The spirit and the scope of the invention are to be limited only by the terms of the appended claims.

What is claimed:

1. In an integrated circuit having a reverse biased zener diode including an N conductivity type cathode formed in a P conductivity type base region which forms the anode of the zener diode in an N substrate region and an NPN transistor including an N conductivity type emitter region formed in said P conductivity type base region which is formed in said N conductivity type substrate region as a collector, said zener diode anode being connected to said NPN base, the improvement being said zener diode comprising:
said N conductivity type cathode region formed in the surface of said P conductivity type region; and
a buried P conductivity type anode region having a greater impurity concentration than said P conductivity type base region extending from the bottom of said N conductivity type cathode region into said P conductivity type base region to form a buried zener diode.

2. The integrated circuit according to claim 1 wherein said buried P conductivity type anode is laterally aligned with and has a smaller lateral area than said N conductivity type cathode region.

3. The integrated circuit according to claim 1 including a P conductivity type region longitudinally aligned with and having a greater lateral area than said N conductivity type cathode region extending into said N substrate a greater depth than said P conductivity type base region.

4. The integrated circuit according to claim 1 wherein said emitter is a ring formed in said base region and said cathode is formed concentrically interior said emitter ring.

5. The integrated circuit according to claim 4 including a P conductivity type anode contact formed as a ring in the surface of said anode region concentrically exterior said cathode region and concentrically interior said emitter ring.

6. The integrated circuit according to claim 5 including a P conductivity region extending into said N substrate a greater depth than said P conductivity type base region and longitudinally aligned with said cathode and extending laterally to said anode contact ring.

7. The integrated circuit according to claim 5 wherein said anode contact ring is also the base contact.

8. The integrated circuit according to claim 4 wherein said cathode region and said buried anode region is a ring, said buried anode region having an exterior diameter less than the exterior diameter of said cathode ring and an interior diameter greater than the diameter of said cathode ring, and a P conductivity type anode contact region in said base region interior said rings.

9. The integrated circuit according to claim 8 including a P conductivity type region extending into said substrate a greater distance than said base region and being longitudinal aligned with an extending laterally a greater distance than said cathode.

10. The integrated circuit according to claim 9 wherein said extending P conductivity type region extends to the surface of said substrate and said cathode and anode of said zener diode is formed in said extending P conductivity type region.

11. The integrated circuit according to claim 9 including a P conductivity type base contact ring formed in said base region concentrically interior said emitter ring and concentrically exterior said cathode ring, and wherein said extending P conductivity type region extends laterally to said base contact ring.

12. An integrated circuit having a reverse biased zener diode formed in the same substrate region that forms the collector of an NPN bipolar transistor comprising:
P conductivity type base ring formed in the surface of said N conductivity substrate region;
an N conductivity type emitter ring formed in the surface of said base ring;
a P conductivity type anode region formed in the surface of said substrate region separate from and interior said base ring;
a P conductivity type anode contact ring formed in the surface of said anode region; and
an N conductivity type cathode region formed in the surface of said anode region interior said anode contact ring.

13. The integrated circuit according to claim 12 including a P conductivity type base contact ring formed in the surface of said base ring and an N conductivity type collector contact ring formed in the surface of said substrate region exterior said base ring.

14. The integrated circuit according to claim 12 including a P conductivity type region of a greater impurity concentration than said anode region extending down from the bottom of said cathode region into said anode region to form a buried zener diode breakdown junction.

15. An integrated circuit having a reverse biased zener diode formed in the same substrate region that forms the collector of an NPN bipolar transistor comprising:

a P conductivity type base region formed in the surface of said N substrate region;

an N conductivity type emitter ring formed in said base region;

a P conductivity type base contact ring formed in said base region interior said emitter ring;

an N conductivity type cathode region formed in the surface of said base region interior said base contact ring;

a P conductivity type region formed in said substrate region below said cathode and extending laterally to said base contact to increase the depth of said base region below said cathode; and a P conductivity type region of a greater impurity concentration than said base region extending down from the bottom of said cathode region into said increased base region to form a buried zener diode.

16. An integrated circuit according to claim 16 wherein said P conductivity type region below said cathode extends down from said base region.

17. An integrated circuit according to claim 16 wherein said P conductivity type region below said cathode extends from the surface of said substrate down into said substrate below said base region.

18. An integrated circuit including a reverse biased zener diode in series with a forward biased diode comprising:

a first N conductivity type cathode region and first P conductivity type anode region of the zener diode having a common boundary below the surface of the substrate region in which they are formed to produce a buried breakdown zener junction; and a second N conductivity type cathode region and second P conductivity type anode region of the forward biased diode having a common boundary in said substrate which encompasses and is symmetrical about said zener diode.

19. The integrated circuit according to claim 18 wherein said first N conductivity type cathode region is a surface region having greater lateral area than said first P conductivity type anode regions.

20. The integrated circuit according to claim 18 wherein said first P conductivity type anode region is a surface region having a greater lateral area than said first P conductivity type cathode region.

21. A process for fabricating a zener diode and NPN bipolar transistor in the same N conductivity type substrate region comprising:

diffusing P conductivity type impurities into the surface of said substrate to form a first P type anode region;

diffusing P conductivity type impurities into the surface of said substrate to form a second P type region having lower impurity concentration than said first P type region;

diffusing N conductivity type impurities into said second P type region to form an emitter ring and into said first P type region to form a cathode region having a buried junction with said first P type anode region;

said substrate forming the collector and said second P type region forming the base of said NPN bipolar transistor.

22. The process according to claim 21 wherein said second P conductivity type impurities diffusion forms said second P type region as a base ring into which said emitter ring is formed and a third P type region in said N substrate surrounding said first P type anode region, interior and spaced from said base ring, said cathode is diffused into said third P type region.

23. The process according to claim 22 including diffusing P type impurities into said base ring to form a base contact ring and into said third P type regions to form an anode contact ring.

24. The process according to claim 22 including diffusing P type impurities into said base region to form a common anode and base contact ring interior said emitter ring and exterior said cathode.

25. The process according to claim 21 including diffusing P conductivity type impurities into said substrate between the first and second diffusing of P conductivity type impurities to form a fourth P type region having a depth greater than second P type region and extending laterally from said first P type region a greater distance than the to be formed N cathode region.

26. The process according to claim 21 wherein said first P type region and said cathode regions are formed as rings and including diffusing P type impurities into said second P type regions to form a base contact ring exterior said cathode ring and an anode contact interior said cathode ring.

27. In an integrated circuit having a reverse biased zener diode connected to the base of an NPN bipolar transistor, said NPN transistor including an N conductivity type emitter region formed in a P conductivity type base region which is formed in an N conductivity type collector region, said zener diode including an N conductivity type cathode region formed in a P conductivity type anode region, the improvement being said zener diode comprising:

said P conductivity type anode region being formed in said N conductivity type collector region separate and distinct from said P conductivity type base region, said N conductivity type cathode region being formed in the surface of said P conductivity type anode region; and a buried P conductivity type anode region having a greater impurity concentration than said P conductivity type anode region extending from the bottom of said N conductivity type cathode region into said P conductivity type anode region to form a buried zener diode.

* * * * *

UNITED STATES PATENT AND TRADEMARK OFFICE
CERTIFICATE OF CORRECTION

PATENT NO. : 4,319,257
DATED : March 9, 1982
INVENTOR(S) : James D. Beasom

It is certified that error appears in the above-identified patent and that said Letters Patent is hereby corrected as shown below:

Column 1
Line 52, delete "defeating" and insert --defeats--
Line 54, delete "their" and insert --there--
Column 6
Line 63, delete "have" and insert --has--
Column 7
Line 42, delete "principle" and insert --principles--
Column 8
Line 30, before "diameter" insert --interior--
Line 37, delete "longitudinal" and insert --longitudinally--
Column 9
Line 34, delete "16" and insert --15--

Signed and Sealed this

Twenty-fourth Day of August 1982

[SEAL]

Attest:

GERALD J. MOSSINGHOFF

Attesting Officer     Commissioner of Patents and Trademarks